US012685168B2

(12) United States Patent
Chen

(10) Patent No.: US 12,685,168 B2
(45) Date of Patent: Jul. 14, 2026

(54) LEAK-PROOF HEAT DISSIPATION STRUCTURE OF HIGH THERMAL CONDUCTIVITY MATERIALS

(71) Applicant: CCHUAN CO., LTD., Taoyuan City (TW)

(72) Inventor: Cheng-Hsiung Chen, Taoyuan City (TW)

(73) Assignee: CCHUAN CO., LTD., Taoyuan City (TW)

( * ) Notice: Subject to any disclaimer, the term of this patent is extended or adjusted under 35 U.S.C. 154(b) by 386 days.

(21) Appl. No.: 18/404,885

(22) Filed: Jan. 5, 2024

(65) Prior Publication Data

US 2025/0079260 A1    Mar. 6, 2025

(30) Foreign Application Priority Data

Sep. 6, 2023    (TW) ................................. 112209569

(51) Int. Cl.
| | |
|---|---|
| *H10W 40/73* | (2026.01) |
| *H10W 20/20* | (2026.01) |
| *H10W 40/70* | (2026.01) |
| *H10W 90/00* | (2026.01) |

(52) U.S. Cl.
CPC ......... *H10W 40/735* (2026.01); *H10W 40/70* (2026.01); *H10W 20/20* (2026.01); *H10W 90/00* (2026.01)

(58) Field of Classification Search
CPC .... H10W 40/735; H10W 40/73; H10W 40/70
See application file for complete search history.

(56) References Cited

U.S. PATENT DOCUMENTS

2024/0090117 A1 *   3/2024   Peng .................... H05K 1/0203

* cited by examiner

*Primary Examiner* — Amar Movva

(57) ABSTRACT

An improved leak-proof heat dissipation structure of high thermal conductivity materials includes an insulating film layer, a high thermal conductivity thermal interface material layer, a first flexible material composite layer, a second flexible material composite layer and a radiator. The insulating film layer has a film opening at the center. The high thermal conductivity thermal interface material layer has its body close to the heat source and located above the chip body. The first flexible material composite layer is set above the insulating film layer, and has a first opening at the center. The second flexible material composite layer is provided below the insulating film layer, and has a second opening at the center. The radiator is placed on the first flexible material composite layer, and has a boss at the bottom and multiple storage grooves on the boss.

11 Claims, 12 Drawing Sheets

100

170

172

172A

170

172

172A

LEAK-PROOF HEAT DISSIPATION STRUCTURE OF HIGH THERMAL CONDUCTIVITY MATERIALS

BACKGROUND OF THE INVENTION

1. Field of the Invention

The present invention relates to a heat dissipation structure, especially an improved leak-proof heat dissipation structure of high thermal conductivity materials used to dissipate heat from the heat source on a chip body.

2. Description of the Related Art

Currently, all kinds of common electronic components are developed and designed in the direction of miniaturization. However, due to various factors such as miniaturization and substantial improvement in performance of various electronic components, it is also easy to generate high heat during actual operation, affecting the overall operating performance. Therefore, conventional micro vapor chambers must be used for heat dissipation. The heat dissipation structure of conventional electronic devices consists of heat sinks arranged on electronic components, and a fan unit is used to guide airflow to the outside of the casing. However, due to the tight arrangement of the components inside the casing, the heat emitted by the heat source cannot be effectively discharged, causing a temperature rise effect inside the casing. Coupled with the vicious cycle of continuous accumulation of heat, if the temperature inside the casing cannot be maintained within the normal range, it will affect the reliability and service life of the entire electronic device, and may cause leakage problems and excessive temperature problems during overclocking. In addition, in order to improve the heat dissipation efficiency, it is necessary to use a high thermal conductivity material layer with a high thermal conductivity. However, overflow during the phase change of the high thermal conductivity material layer will cause short circuit problems on the motherboard, and uneven heat source locations will also cause unstable heat dissipation.

In addition, after gradually entering the post-Moore's Law era, the development focus of major wafer foundries has gradually shifted from the pursuit of more advanced nanometer processes in the past to the innovation of packaging technology. As the demand for high-performance computing (HPC) chips is rapidly increasing, data center and cloud computing infrastructure have become critical, especially AI and 5G equipment that can support new high-performance technologies. But the challenge with these devices is that the high performance of the device and its multi-core architecture will come with high bandwidth density and low latency. Heterogeneous integration has become a factor in the surge in demand for HPC chips and has opened a new page for 3D IC packaging technology. Through silicon via technology (TSV) realizes vertical interconnection between Die and Die. Inter-wafer interconnection is carried out by drilling through holes on Si, eliminating the need for wire bonding, effectively shortening the length of interconnect lines, reducing signal transmission delays and losses, increasing signal speed and bandwidth, and reducing power consumption and packaging volume. It is a chip system-level package that achieves multi-function, high performance, high reliability and is lighter, thinner and smaller. Because the 3D TSV packaging technology is immature in terms of design, mass production, testing and supply chain, and the process cost is high, and the internal packaging problems of the 3D TSV packaging technology will cause the high thermal conductivity material layer to pump out, thereby affecting the overall performance of the chip.

SUMMARY OF THE INVENTION

The present invention provides an improved leak-proof heat dissipation structure of high thermal conductivity materials used to dissipate heat from a heat source on a chip body. The improved leak-proof heat dissipation structure of high thermal conductivity materials comprises an insulating film layer, a high thermal conductivity thermal interface material layer, a first flexible material composite layer, a second flexible material composite layer and a radiator. The central area of the insulating film layer is a film opening. The insulating film layer is placed on the top of the heat source. The body of the high thermal conductivity thermal interface material layer is close to the heat source and is located above the chip body. The high thermal conductivity thermal interface material layer is provided in the film opening. The first flexible material composite layer is placed on the top of the insulating film layer. The central area of the first flexible material composite layer is a first opening. The first flexible material composite layer is sticky on both sides. The second flexible material composite layer is located below the insulating film layer. The central area of the second flexible material composite layer is a second opening. The second flexible material composite layer is sticky on both sides. The radiator is disposed on the first flexible material composite layer and adhered to the first flexible material composite layer. The radiator has a boss at the bottom, and the boss has a plurality of storage grooves. The thickness of the boss is 0.1~10 mm and the depth of the storage grooves is 0.01~1 mm.

In one embodiment of the present invention, the size of the boss corresponds to the size of the first opening.

In one embodiment of the present invention, the size of each side of the film opening, the first opening and the second opening is respectively 0.1 to 1 mm larger than the size of each side of the heat source.

In one embodiment of the present invention, the insulating film layer comprises a bevel at an edge thereof near the polar position of the heat source for identification to identify the installation direction, and a handle as a force application point for tearing off the insulating film layer.

In one embodiment of the present invention, the first flexible material composite layer is composed of a first adhesive layer, a first foam layer and a second adhesive layer from top to bottom.

In one embodiment of the present invention, the second flexible material composite layer is composed of a third adhesive layer, a second foam layer and a fourth adhesive layer from top to bottom.

In one embodiment of the present invention, the storage grooves each have a square shape.

In one embodiment of the present invention, the storage grooves each have a circular shape.

In one embodiment of the present invention, the storage grooves each have a hexagonal shape.

In one embodiment of the present invention, the improved leak-proof heat dissipation structure of high thermal conductivity materials further comprises one of insulating glue, insulating paste and insulating mud selectively made of rubber sponge, foam, fireproof material or compressible material and arranged on a small part on the chip body next to the heat source to surround the high thermal conductivity thermal interface material layer, the first flexible material composite layer and the second flexible material composite layer.

It will be easier to understand the purpose, technical content, characteristics and achieved effects of the present invention through detailed description of specific embodiments below.

DETAILED DESCRIPTION OF THE PREFERRED EMBODIMENT

In order to solve the problems of current leakage and insufficient heat dissipation in the existing heat dissipation structure and the internal packaging problem of 3D TSV packaging technology that will cause the high thermal conductivity material to pump out, after years of research and development, the inventor has improved the criticisms of existing products. Later, we will introduce in detail how the present invention uses an improved leak-proof heat dissipation structure of high thermal conductivity materials to achieve the most efficient functional requirements.

Figure 1:
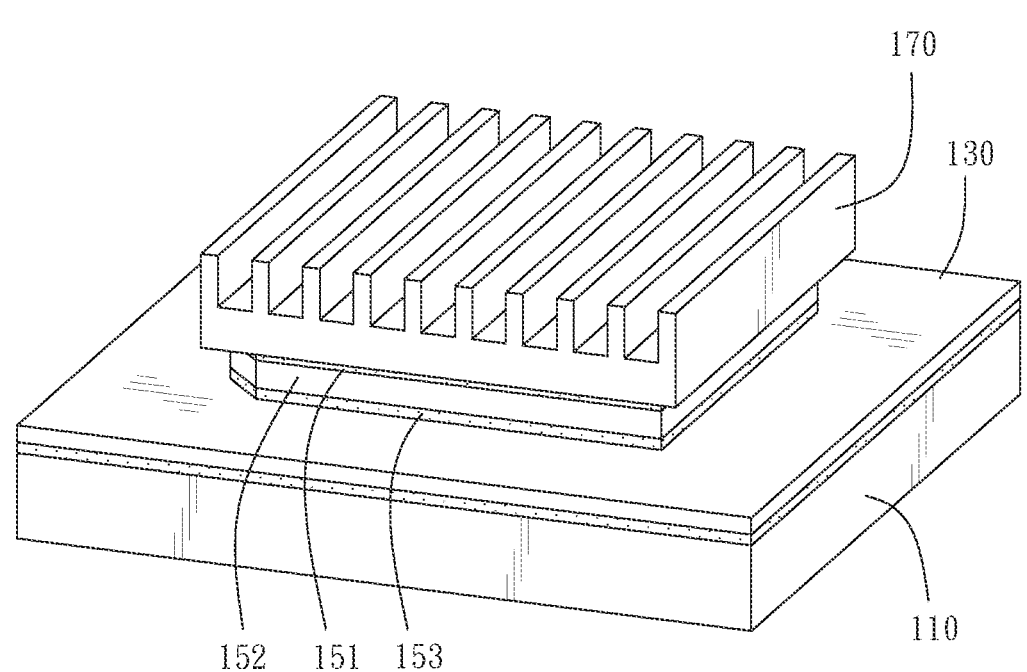
FIG. 1 is a three-dimensional schematic diagram of the improved leak-proof heat dissipation structure of high thermal conductivity materials created of the present invention.
Figure 2:
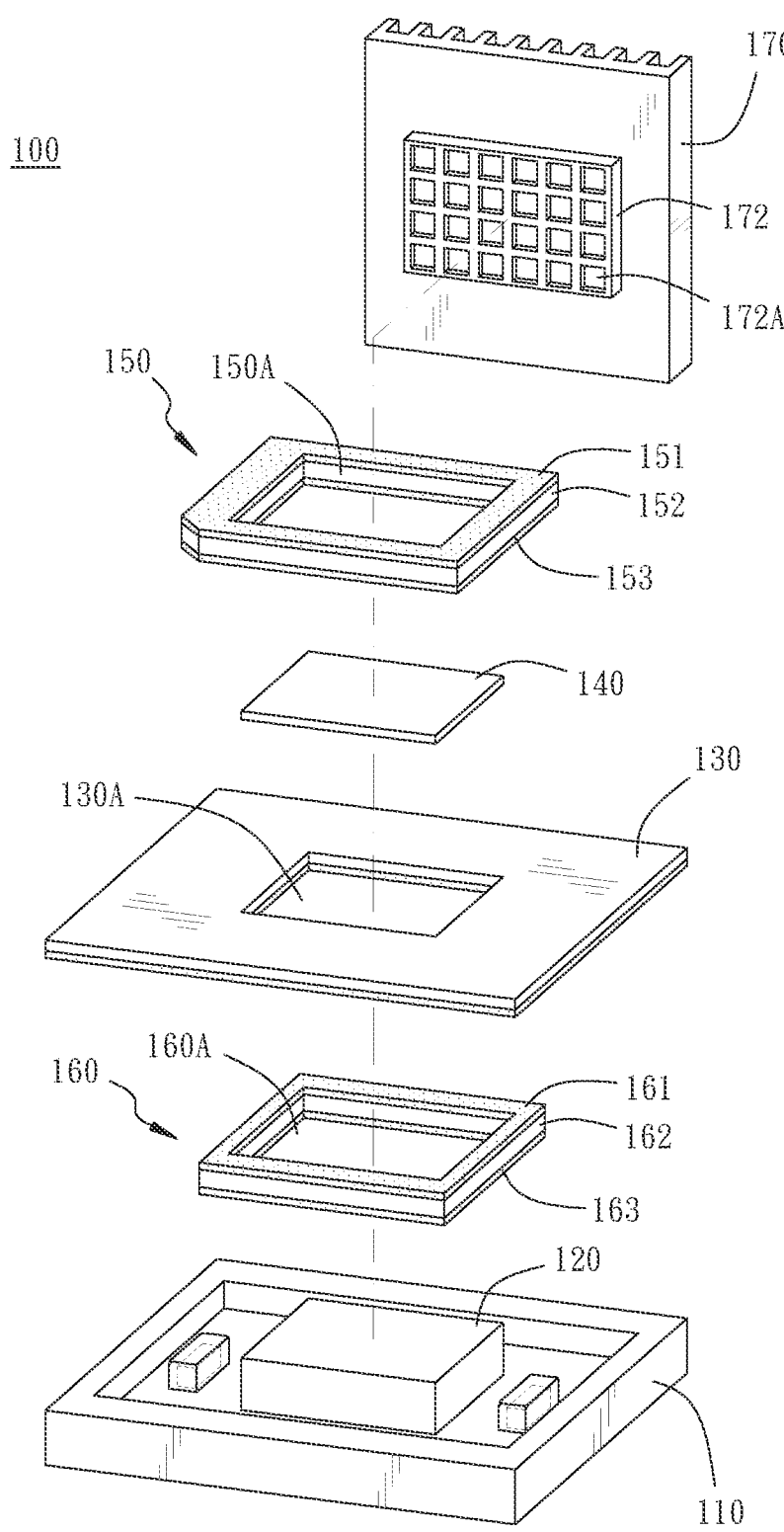
FIG. 2 is a three-dimensional exploded view of the improved leak-proof heat dissipation structure of high thermal conductivity materials of the present invention.
Figure 3:
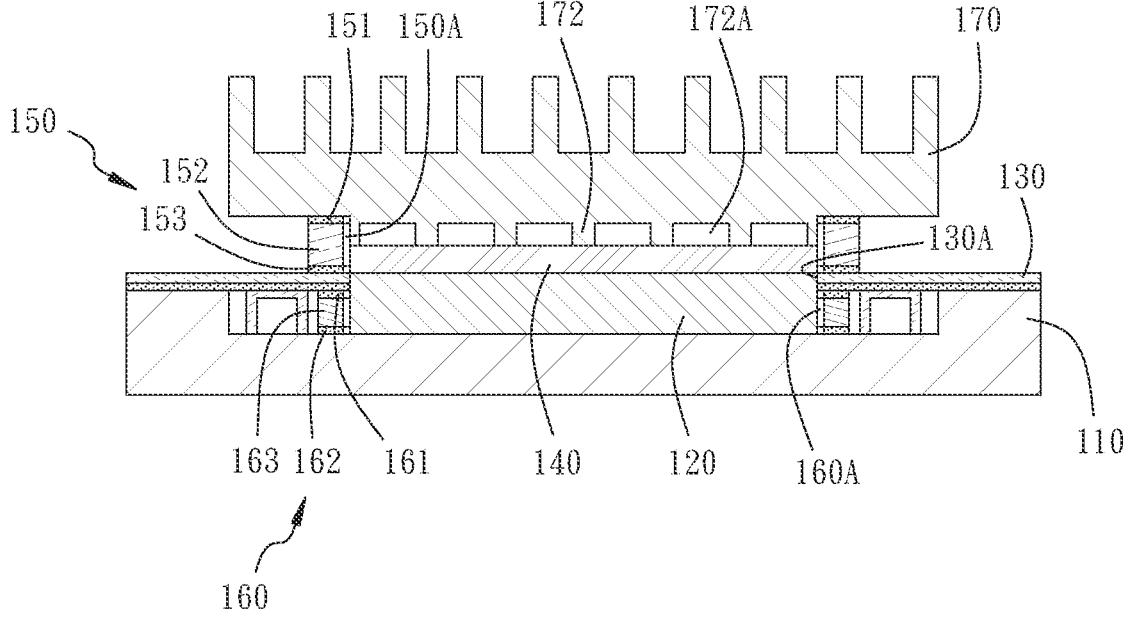
FIG. 3 is a cross-sectional view of the improved leak-proof heat dissipation structure of high thermal conductivity materials of the present invention.
Figure 4:
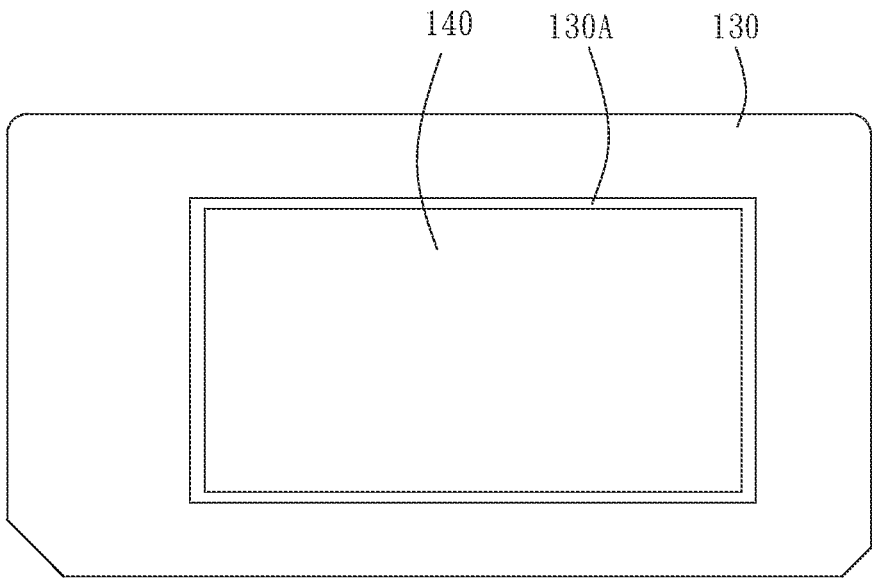
FIG. 4 is a first implementation diagram of the high thermal conductivity thermal interface material layer of the improved leak-proof heat dissipation structure of high thermal conductivity materials of the present invention.
Figure 10:
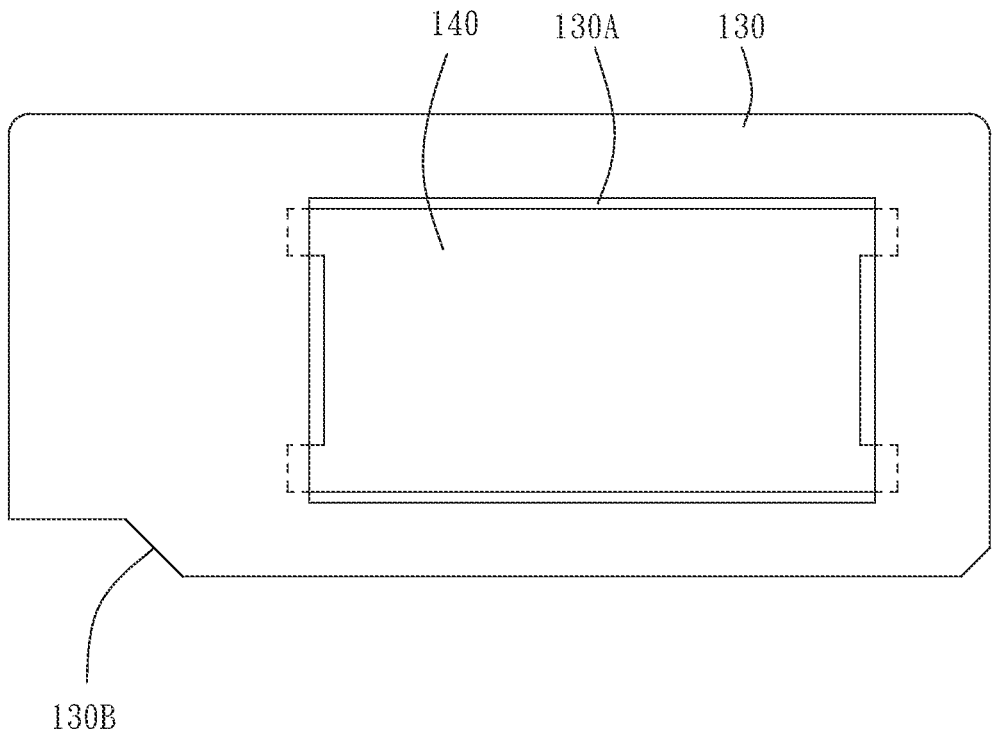
FIG. 10 is a schematic diagram of an implementation method of the improved leak-proof heat dissipation structure of high thermal conductivity materials of the present invention.
Figure 11:
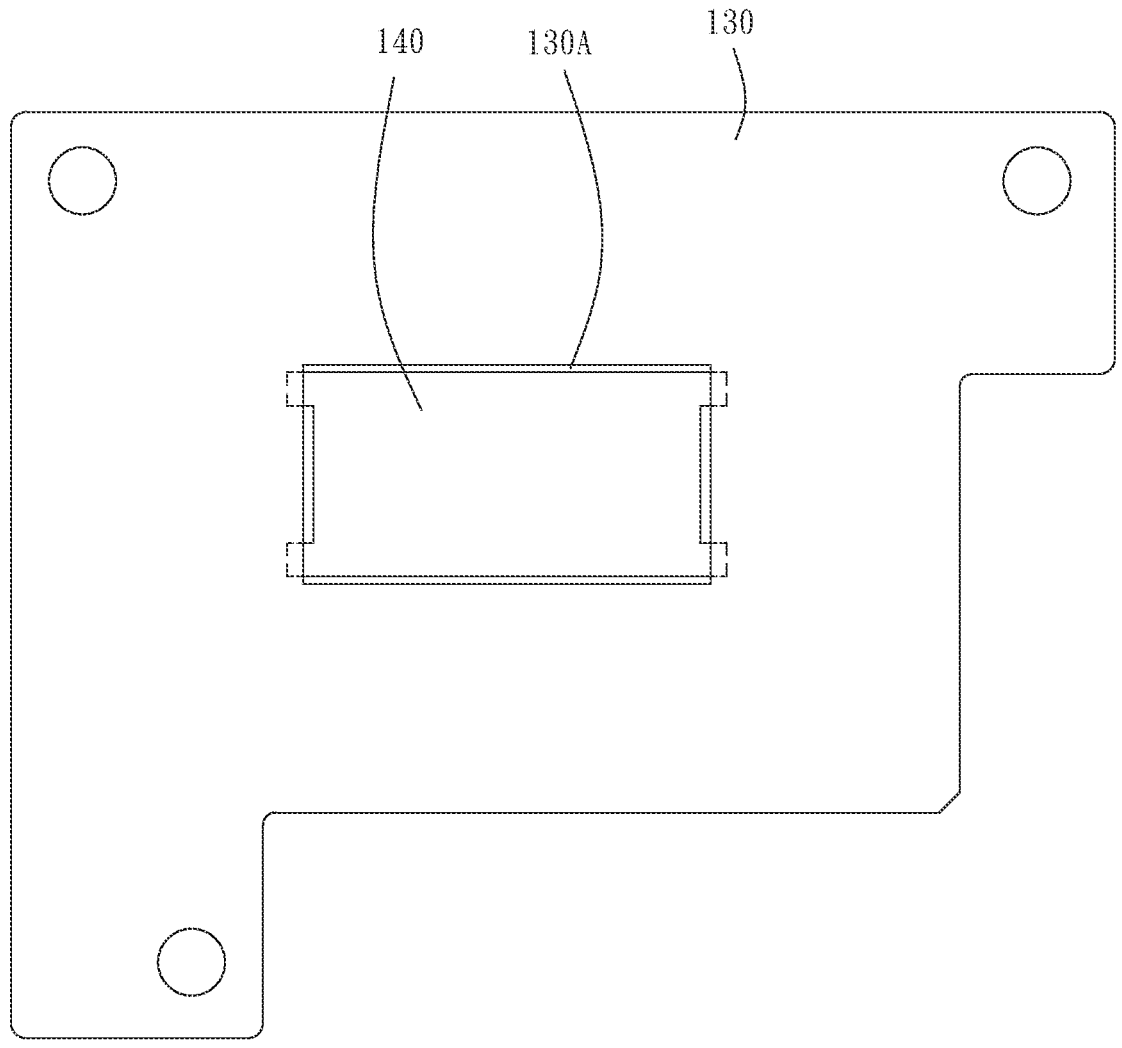
FIG. 11 is a schematic diagram of another implementation method of the improved leak-proof heat dissipation structure of high thermal conductivity materials of the present invention.

Please refer to FIGS. 1 to 4 and 10 to 11, where FIG. 1 is a three-dimensional schematic diagram of the improved leak-proof heat dissipation structure of high thermal conductivity materials created of the present invention, FIG. 2 is a three-dimensional exploded view of the improved leak-proof heat dissipation structure of high thermal conductivity materials of the present invention, FIG. 3 is a cross-sectional view of the improved leak-proof heat dissipation structure of high thermal conductivity materials of the present invention, FIG. 4 is a first implementation diagram of the high thermal conductivity thermal interface material layer of the improved leak-proof heat dissipation structure of high thermal conductivity materials of the present invention, FIG. 10 is a schematic diagram of an implementation method of the improved leak-proof heat dissipation structure of high thermal conductivity materials of the present invention, and FIG. 11 is a schematic diagram of another implementation method of the improved leak-proof heat dissipation structure of high thermal conductivity materials of the present invention. As shown in the figures, in embodiment of the present invention, the heat source 120 is a chip or a metal lid or an integrated heat spreader (IHS). However, there may usually be some leakage on the surface of the chip body 110 caused by internal electronic components. The embodiment of the present invention proposes a solution that can effectively solve the leakage problem. It will be further described below. The improved leak-proof heat dissipation structure of high thermal conductivity materials 100 of this invention is suitable for dissipating heat from the heat source 120 on the chip body 110. The improved leak-proof heat dissipation structure of high thermal conductivity materials 110 comprises an insulating film layer 130, a high thermal conductivity thermal interface material layer 140, a first flexible material composite layer 150, a second flexible material composite layer 160 and a radiator 170. The central area of the insulating film layer 130 is a film opening 130A. The insulating film layer 130 is disposed on the heat source 120, and the edge of the insulating film layer 130 has at least one installation hole for installation or alignment. As shown in FIG. 11, the shape of the insulating film layer 130 can be changed in other embodiments to make mounting holes at relative positions. The insulating film layer 130 can be rubber sponge, foam, fireproof material or compressible material, In addition, as shown in FIG. 10, the edge of the insulating film layer 130 (near the polar position of the heat source 120) has a bevel 130B for identification to identify the installation direction, and has a handle as a force application point for tearing off the insulating film layer 130. The body of the high thermal conductivity thermal interface material layer 140 is close to the heat source 120 and located above the chip body 110. The high thermal conductivity thermal interface material layer 140 is provided at the film opening 130A, and the high thermal conductivity thermal interface material layer 140 may be a liquid metal layer, but is not limited thereto. The first flexible material composite layer 150 is arranged on the insulating film layer 130. The central area of the first flexible material composite layer 150 is a first opening 150A, where both sides of the first flexible material composite layer 150 are sticky. The first flexible material composite layer 150 can be rubber sponge, foam, fireproof material or compressible materials, but this is not a limitation. The second flexible material composite layer 160 is disposed below the insulating film layer 130. The central area of the second flexible material composite layer 160 is a second opening 160A. Both sides of the second flexible material composite layer 160 are sticky, and the second flexible material composite layer 160 can be rubber sponge, foam, fireproof material or compressible material, but this is not a limitation. The radiator 170 is disposed on the first flexible material composite layer 150 and adhered to the first flexible material composite layer 150. The bottom of the radiator 170 has a boss 172, and the boss 172 has a plurality of storage grooves 172A. The thickness of the boss 172 is 0.1-10 mm and the depth of the storage grooves 172A is 0.01-1 mm. It is worth noting that the size of the boss 172 corresponds to the size of the first opening 150A. The size of each side of the film opening 130A, the first opening 140A and the second opening 150A is correspondingly larger than the size of each side of the heat source 120 by 0.1 to 1 mm. In addition, the first flexible material composite layer 150 is composed of a first adhesive layer 151, a first foam layer 152 and a second adhesive layer 153 from top to bottom. The second flexible material composite layer 160 is composed of a third adhesive layer 161, a second foam layer 162 and a fourth adhesive layer 163 from top to bottom. In addition to their own foam materials, the above-mentioned first foam layer 152 and second foam layer 162 can also be made of rubber sponge, fireproof material or compressible material.

Figure 5:
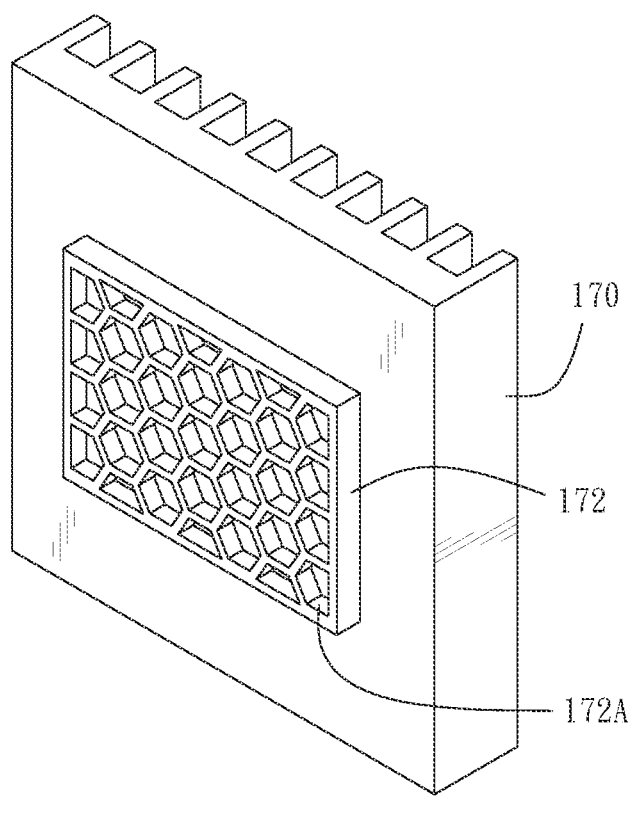
FIG. 5 is a diagram of the first implementation of the radiator of the improved leak-proof heat dissipation structure of high thermal conductivity materials of the present invention.
Figure 6:
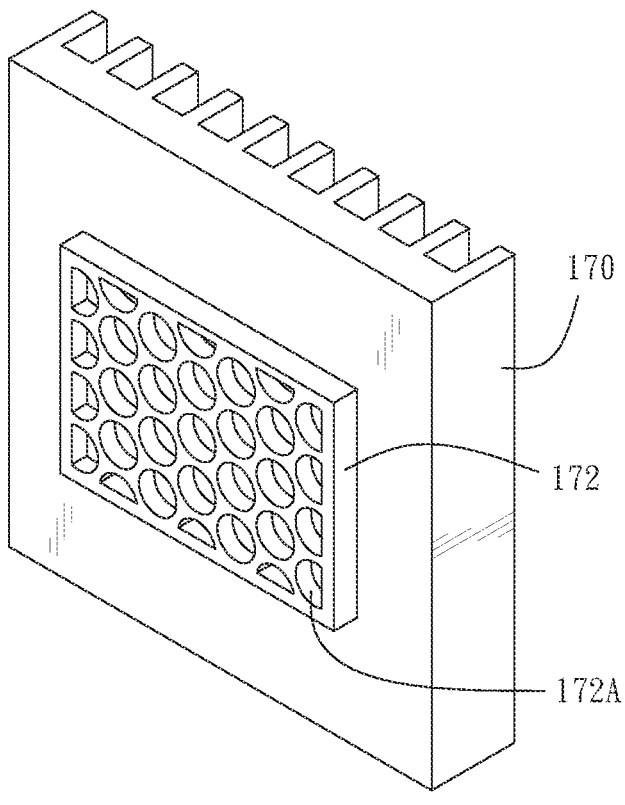
FIG. 6 is a diagram of an alternate form of the radiator of the improved leak-proof heat dissipation structure of high thermal conductivity materials of the present invention.
Figure 7:
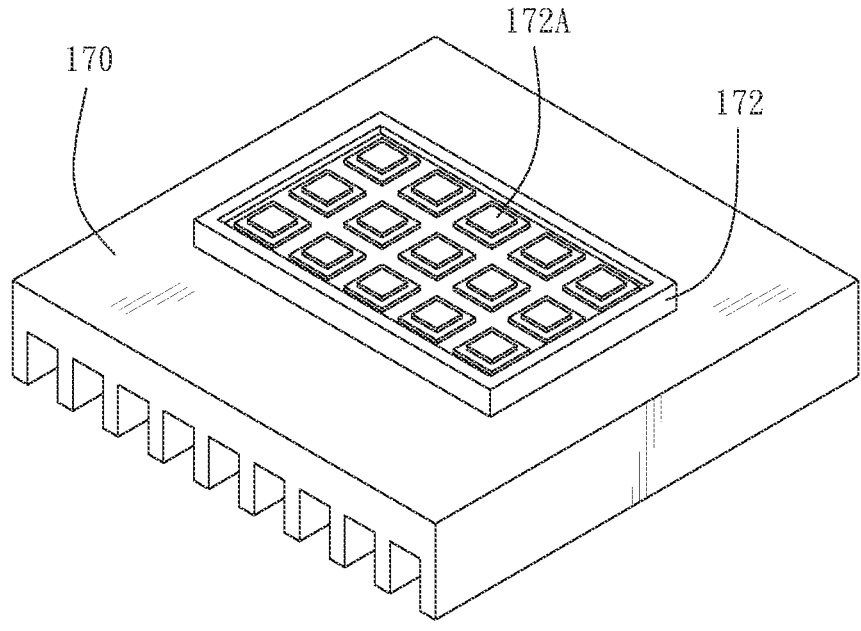
FIG. 7 is a diagram of another alternate form of the radiator of the improved leak-proof heat dissipation structure of high thermal conductivity materials of the present invention.

It should be noted that, please refer to FIGS. 2-7 at the same time, where FIG. 5 is a diagram of the first implementation of the radiator of the improved leak-proof heat dissipation structure of high thermal conductivity materials of the present invention, FIG. 6 is a diagram of an alternate form of the radiator of the improved leak-proof heat dissipation structure of high thermal conductivity materials of the present invention, and FIG. 7 is a diagram of another alternate form of the radiator of the improved leak-proof heat dissipation structure of high thermal conductivity materials of the present invention. Regarding the radiator 170 of the present invention, its bottom has a special structure, which will be further explained below. The bottom of the radiator 170 has a boss 172, and the boss 172 has a plurality of storage grooves 172A, wherein the thickness of the boss 172 is 0.1-10 mm and the depth of the storage grooves 172A is 0.01-1 mm. It is worth noting that the size of the boss 172 corresponds to the size of the first opening 150A. The size of each side of the film opening 130A, the first opening 140A and the second opening 150A is correspondingly larger than the size of each side of the heat source 120 by 0.1 to 1 mm. The function of the boss 172 can bring the multiple storage grooves 172A closer to the high thermal conductivity thermal interface material layer 140, that is, they can be in closer contact during assembly or packaging. As shown in FIGS. 5-7, the storage grooves 172A of the boss 172 of the radiator 170 can be square, circular, hexagonal grooves or other polygonal appearances, but are not limited to this, as long as there are multiple storage grooves, they are the spirit of the present invention. For example, in the embodiment of FIG. 2 of the present invention, each of the storage grooves 172A of the radiator 170 is a square illustrative embodiment, which is used as an illustration and the depth of the storage grooves 172A in the embodiment of the invention is 0.01~1 mm. Other storage grooves 172A, such as hexagons (FIG. 5), circles (FIG. 6) or stepped (FIG. 7), can be proved in the same way. The radiator 170 in the embodiments of the present invention can be a fin-type radiator, but is not limited to this. In actual practice, the radiator 170 will also use other fixings to be combined and fixed with the improved leak-proof heat dissipation structure of high thermal conductivity materials 100. In the semiconductor packaging process, the radiator 170 can be surface-bonded with the high thermal conductivity thermal interface material layer 140 through this industrial adhesive. The improved leak-proof heat dissipation structure of high thermal conductivity materials 100 disclosed above can prevent side leakage of liquid metal, and in the embodiments of the present invention, the problem of excessive temperature during overclocking can be solved.

Furthermore, the improved leak-proof heat dissipation structure of high thermal conductivity materials 100 also comprises an insulating glue 180. The insulating glue 180 is bonded between the radiator 170 and the chip body 110, and is located around the high thermal conductivity thermal interface material layer 140, the first flexible material composite layer 150 and the second flexible material composite layer 160 to cover them. The insulating glue 180 will function like a retaining wall to prevent side leakage of liquid metal. The insulating glue 180 (this is the insulating layer, which can also be insulating paste, insulating mud or industrial adhesive) can be rubber sponge, foam, fireproof material or compressible material. Furthermore, when the high thermal conductivity thermal interface material layer 140 exceeds 60 degrees Celsius (or exceeds 45 degrees Celsius, in another embodiment) and begins to melt, because of the function of the insulating glue 180 as a retaining wall, the melted liquid metal in the high thermal conductivity thermal interface material layer 140 will flow into the storage grooves 172A. Furthermore, the plurality of storage grooves 172A can have enough space to accommodate the melted high thermal conductivity thermal interface material layer 140. Because the high thermal conductivity thermal interface material layer 140 will undergo phase changes due to the temperature during use, such as solid state turning into liquid state (thick liquid or gel state), but its volume will increase by 1.01 to 1.05 times during the phase change, therefore, using the characteristics of the reservoir, the insulating glue 180, insulating paste or insulating mud on the chip is stored in a storage containment method, so that the excess amount can be stored in the desired place (high temperature resistant foam layer or multiple storage grooves 172A), it can be expected to have sufficient volume for use when the temperature of the chip changes. In order to improve the heat dissipation efficiency, it is necessary to use high thermal conductivity thermal interface material layer 140 with higher thermal conductivity. The embodiments of the present invention prevent the motherboard short circuit problem caused by the overflow of the high thermal conductivity thermal interface material layer 140 during phase change, and can also solve the unstable heat dissipation caused by the uneven heating position of the heat source, allowing the high thermal conductivity of the high thermal conductivity thermal interface material layer 130 to be brought into play. As can be seen from the above description, the purpose of the present invention is to solve the problem that high thermal conductivity interface materials (thermal interface materials) are prone to overflow or pump out due to their non-viscosity or low viscosity.

Figure 8:
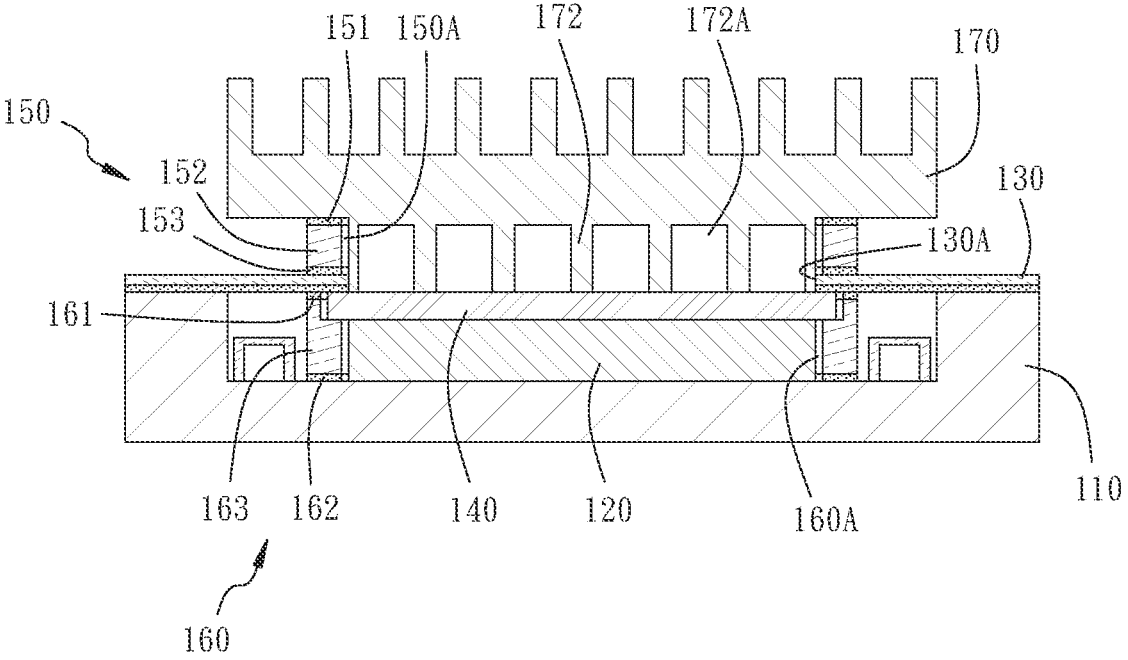
FIG. 8 is a schematic diagram of the improved leak-proof heat dissipation structure of high thermal conductivity materials of the present invention in which the high thermal conductivity thermal interface material layer is located under the insulating film layer.
Figure 9:
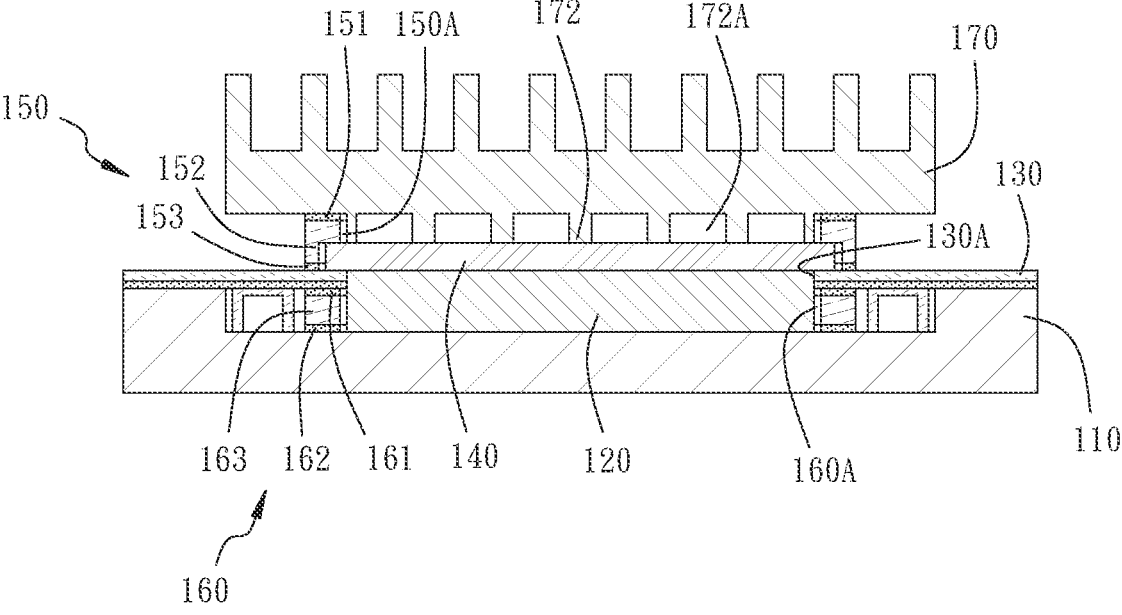
FIG. 9 is a schematic diagram of the improved leak-proof heat dissipation structure of high thermal conductivity materials of the present invention in which the high thermal conductivity thermal interface material layer is located above the insulating film layer.

Next, please refer to FIGS. 8 and 9, where FIG. 8 is a schematic diagram of the improved leak-proof heat dissipation structure of high thermal conductivity materials of the present invention in which the high thermal conductivity thermal interface material layer is located under the insulating film layer, and FIG. 9 is a schematic diagram of the improved leak-proof heat dissipation structure of high thermal conductivity materials of the present invention in which the high thermal conductivity thermal interface material layer is located above the insulating film layer. In another embodiment of the present invention, the high thermal conductivity thermal interface material layer 140 can be located under the insulating film layer 130, as shown in FIG. 8. In still another embodiment of the present invention, the high thermal conductivity thermal interface material layer 140 can be located on the insulating film layer 130, as shown in FIG. 9.

Figure 12:
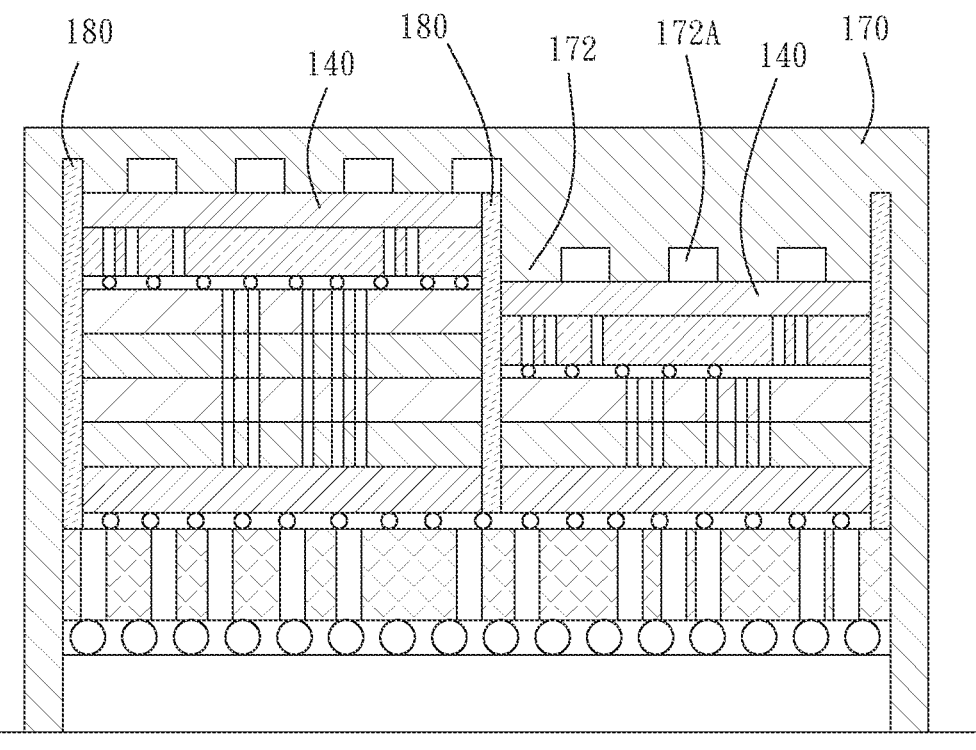
FIG. 12 is a schematic diagram of still another implementation method of the improved leak-proof heat dissipation structure of high thermal conductivity materials of the present invention.

It is worth mentioning that please refer to FIG. 12, which is a schematic diagram of still another implementation method of the improved leak-proof heat dissipation structure of high thermal conductivity materials of the present invention. Since the 3D TSV packaging technology is immature in terms of design, mass production, testing and supply chain, and the process cost is high, the internal packaging problems of the 3D TSV packaging technology will cause the high thermal conductivity thermal interface material layer 140 to pump out, thereby affecting the overall performance of the chip. As can be seen from FIG. 10, by making the boss 172 at the bottom of the radiator 170 into a plurality of storage grooves 172A, and then sealing them with insulating glue, insulating paste or insulating mud, or sealing them with industrial adhesives, it can effectively solve the internal packaging problems of 3D TSV packaging technology.

In summary, the improved leak-proof heat dissipation structure of high thermal conductivity materials disclosed in this invention can achieve the following effects:

1. Reduce the risk of leakage during assembly of high thermal conductivity material layers due to conductive circuits of parts.
2. Solve the problem that the internal packaging of 3D TSV packaging technology will cause high thermal conductivity materials to pump out.
3. Solve the problem of frequency reduction of high-power chips during operation.
4. Solve the problem of excessive temperature during overclocking.
5. Solve the problem of unstable heat dissipation during repetitive testing.
6. Improve the reliability of practical applications of high thermal conductivity materials.

What the invention claimed is:

1. An improved leak-proof heat dissipation structure of high thermal conductivity materials used to dissipate heat from a heat source on a chip body, said improved leak-proof heat dissipation structure of high thermal conductivity materials comprising:

an insulating film layer placed on a top of said heat source, said insulating film layer comprising a film opening located at a central area thereof;
a high thermal conductivity thermal interface material layer disposed close to said heat source and located above said chip body, said high thermal conductivity thermal interface material layer being provided in said film opening;
a first flexible material composite layer placed on a top of said insulating film layer, said first flexible material composite layer comprising a first opening located at a central area thereof, said first flexible material composite layer being sticky on two opposite sides thereof;
a second flexible material composite layer provided below said insulating film layer, said second flexible material composite layer comprising a second opening located at a central area thereof, said second flexible material composite layer being sticky on two opposite sides thereof; and
a radiator disposed on a top of said first flexible material composite layer and bonded to said first flexible material composite layer, said radiator comprising a boss located at a bottom thereof and a plurality of storage grooves located on said boss, said boss having a thickness of 0.1~10 mm, said storage grooves having a depth of 0.01~1 mm.

2. The improved leak-proof heat dissipation structure of high thermal conductivity materials as claimed in claim 1, wherein the size of the boss corresponds to the size of said first opening.

3. The improved leak-proof heat dissipation structure of high thermal conductivity materials as claimed in claim 1, wherein the size of each side of said film opening, said first opening and said second opening is correspondingly larger than the size of each side of said heat source by 0.1 to 1 mm.

4. The improved leak-proof heat dissipation structure of high thermal conductivity materials as claimed in claim 1, wherein said insulating film layer comprises at least one installation hole at an edge thereof for installation or alignment.

5. The improved leak-proof heat dissipation structure of high thermal conductivity materials as claimed in claim 1, wherein said insulating film layer comprises a bevel at an edge thereof near the polar position of said heat source for identification to identify the installation direction, and a handle as a force application point for tearing off said insulating film layer.

6. The improved leak-proof heat dissipation structure of high thermal conductivity materials as claimed in claim 1, wherein said first flexible material composite layer is composed of a first adhesive layer, a first foam layer and a second adhesive layer from top to bottom.

7. The improved leak-proof heat dissipation structure of high thermal conductivity materials as claimed in claim 1, wherein said second flexible material composite layer is composed of a third adhesive layer, a second foam layer and a fourth adhesive layer from top to bottom.

8. The improved leak-proof heat dissipation structure of high thermal conductivity materials as claimed in claim 1, wherein said storage grooves each have a square shape.

9. The improved leak-proof heat dissipation structure of high thermal conductivity materials as claimed in claim 1, wherein said storage grooves each have a circular shape.

10. The improved leak-proof heat dissipation structure of high thermal conductivity materials as claimed in claim 1, wherein said storage grooves each have a hexagonal shape.

11. The improved leak-proof heat dissipation structure of high thermal conductivity materials as claimed in claim 1, further comprising one of insulating glue, insulating paste and insulating mud selectively made of rubber sponge, foam, fireproof material or compressible material and arranged on a small part on said chip body next to said heat source to surround said high thermal conductivity thermal interface material layer, said first flexible material composite layer and said second flexible material composite layer.

* * * * *